United States Patent
Mori

(10) Patent No.: US 9,553,144 B2
(45) Date of Patent: Jan. 24, 2017

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Toru Mori, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/819,562

(22) Filed: Aug. 6, 2015

(65) Prior Publication Data

US 2016/0056237 A1    Feb. 25, 2016

(30) Foreign Application Priority Data

Aug. 19, 2014   (JP) .................. 2014-166508

(51) Int. Cl.
| | | |
|---|---|---|
| H01L 29/00 | (2006.01) | |
| H01L 29/06 | (2006.01) | |
| H01L 29/66 | (2006.01) | |
| H01L 29/78 | (2006.01) | |
| H01L 29/10 | (2006.01) | |

(52) U.S. Cl.
CPC ......... H01L 29/0696 (2013.01); H01L 29/063 (2013.01); H01L 29/66659 (2013.01); H01L 29/7835 (2013.01); H01L 29/0653 (2013.01); H01L 29/1045 (2013.01)

(58) Field of Classification Search
CPC ............. H01L 29/0696; H01L 29/7816; H01L 29/0873; H01L 29/0856; H01L 29/1095; H01L 21/283
See application file for complete search history.

(56) References Cited

U.S. PATENT DOCUMENTS

2008/0079072 A1*   4/2008 Lee ..................... H01L 29/7835
                                                           257/335

FOREIGN PATENT DOCUMENTS

JP         05-259454        8/1993

* cited by examiner

*Primary Examiner* — Dale E Page
*Assistant Examiner* — Quovaunda V Jefferson
(74) *Attorney, Agent, or Firm* — Volentine & Whitt, PLLC

(57) ABSTRACT

A semiconductor device includes a semiconductor substrate; a first semiconductor region that includes an extension portion extending in a specific direction at a specific width as viewed along a direction orthogonal to the main surface; a second semiconductor region that is shaped to include a portion running along the extension portion of the first semiconductor region as viewed along the direction orthogonal to the main surface; a field relaxation layer that relaxes a field generated between the first semiconductor region and the second semiconductor region, that is formed on the second semiconductor region side of the main surface, and that is formed by a semiconductor layer; and a conductor that is connected to the second semiconductor region, and that has an end portion on the first conductor region side positioned within the range of the field relaxation layer.

9 Claims, 7 Drawing Sheets

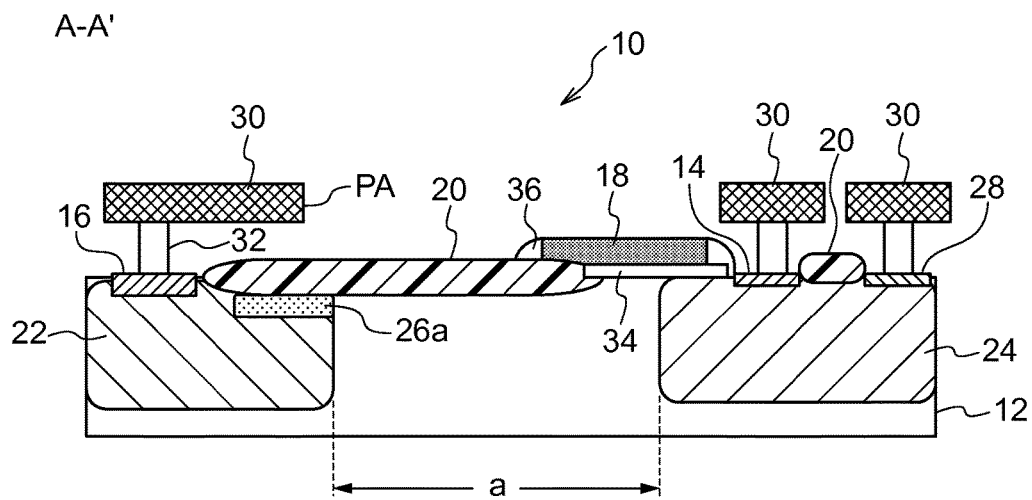
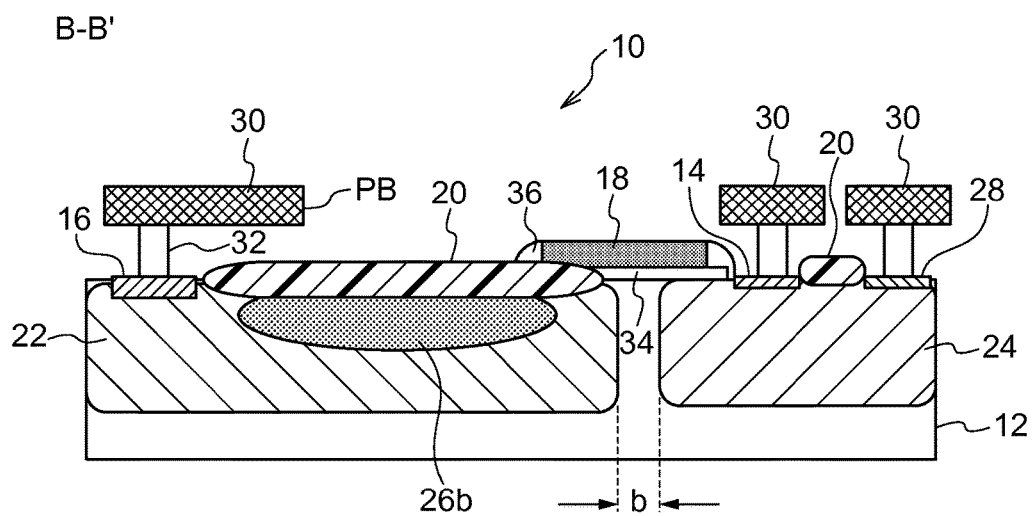

POSITION OF END PORTION PA

SEMICONDUCTOR DEVICE AND SEMICONDUCTOR DEVICE MANUFACTURING METHOD

CROSS-REFERENCE TO RELATED APPLICATION

This application is based on and claims priority under 35 USC 119 from Japanese Patent Application No. 2014-166508 filed on Aug. 19, 2014, the disclosure of which is incorporated by reference herein.

BACKGROUND

Technical Field

The present invention relates to a semiconductor device and a manufacturing method for the semiconductor device.

Related Art

Attention is being given to various approaches for maintaining a high withstand voltage in semiconductors for high power applications. For example, a field effect transistor described by Japanese Patent Application Laid-Open (JP-A) No. H05-259454 is known as a semiconductor device for high withstand voltage applications according to conventional technology.

A field effect transistor 50 described by JP-A No. H05-259454 is illustrated in FIG. 5, FIG. 6A, and FIG. 6B. FIG. 5 is a plan view of the field effect transistor 50, FIG. 6A is a cross-section of the field effect transistor 50 taken along C-C' in FIG. 5, and FIG. 6B is a cross-section of the field effect transistor 50 taken along line D-D' in FIG. 5. The field effect transistor 50 is a field effect transistor with a structure known as a finger-type.

As illustrated in FIG. 5, the structure of the field effect transistor 50 is such that a U-shaped drain layer 116 is surrounded by a source layer 114, and a finger portion F that is a projection shaped portion of the source layer 114 extends into the U-shaped drain layer 116.

A gate electrode 118 is formed around the source layer 114, and a field oxide layer 120 is formed between the gate electrode 118 and the drain layer 116. The outside of the source layer 114 is surrounded by a sub-contact layer 128, and a portion of the sub-contact layer 128 extends into the protruding finger portion F. Although respective metal wiring 130 is connected to the source layer 114, the drain layer 116, and the sub-contact layer 128 through contacts, FIG. 5 only illustrates the metal wiring 130 connected to the drain layer 116.

As illustrated in FIG. 6A, the cross-section structure of the vicinity of the finger portion F is such that the drain layer 116 is formed by impurities diffused in a substrate 112, and a drift layer 122 exhibiting the same conduction type is diffused at the outside of the drain layer 116. The drain layer 116 is connected to the metal wiring 130 through a contact 132.

The source layer 114 is formed by impurities diffused in the substrate 112, and a Vt (threshold value) adjusting layer 124 is diffused at the outside of the source layer 114. Moreover, the sub-contact layer 128 is diffused within the Vt adjusting layer 124. The sub-contact layer 128 and the source layer 114 are connected to metal wiring 130 through contacts 132. As illustrated in FIG. 6A, the distance between an end portion of the drift layer 122 and an end portion of the Vt adjusting layer 124 that face each other is taken as c.

As illustrated in FIG. 6B, a cross-section structure of a U-shaped outside portion of the drain layer 116 has a substantially similar structure to the cross-section structure of the vicinity of the protruding finger portion F. However, the distance between the end portion of the drift layer 122 and the end portion of the Vt adjusting layer 124 is taken as d (<c), and a field relaxation layer 126 is formed at a lower portion of the field oxide layer 120.

In JP-A No. H05-259454, a higher breakdown voltage can be obtained between the source and the drain using the above configuration than in field effect transistors of related technology in with similar dimensions.

However, in the field effect transistor 50 described by JP-A No. H05-259454, no field relaxation layer is provided in the vicinity of the finger portion F, and no particular mechanism is implemented by the metal wiring at the periphery of the drain layer 116. Field relaxation is therefore insufficient in the vicinity of the finger portion F, and in particular, in the vicinity of the leading end PF of the finger portion F, and there is an issue in that dielectric breakdown is liable to occur at the finger portion F, and in particular, at the leading end PF when high voltage is applied to the drain layer or the source layer.

SUMMARY

In order to solve the issues described above, the present invention provides a semiconductor device in which decreases in withstand voltage are suppressed, and a manufacturing method for the semiconductor device.

A first aspect of the present invention provides a semiconductor device including:

a semiconductor substrate;

a first semiconductor region, exhibiting a first conduction type, that is formed on a main surface of the semiconductor substrate, and that includes an extension portion extending in a specific direction at a specific width as viewed along a direction orthogonal to the main surface;

a second semiconductor region, exhibiting the first conduction type, that is formed on the main surface separated from the first semiconductor region, and that is shaped to include a portion running along the extension portion of the first semiconductor region as viewed along the direction orthogonal to the main surface;

a field relaxation layer that relaxes a field generated between the first semiconductor region and the second semiconductor region, that is formed on the second semiconductor region side of the main surface, and that is formed by a semiconductor layer exhibiting a second conduction type that is a different conduction type from the first conduction type; and a conductor that is connected to the second semiconductor region, and that has an end portion on the first conductor region side positioned within the range of the field relaxation layer.

A second aspect of the present invention provides a method of manufacturing a semiconductor device, the method including:

forming, on a main surface of a semiconductor substrate, a field relaxation layer that is formed from a semiconductor layer exhibiting first conduction type, and that relaxes a field;

forming, on the main surface separated from one end of the field relaxation layer, a first semiconductor region that is shaped to include an extension portion extending in a specific direction at a specific width as viewed along a direction orthogonal to the main surface, and that exhibits a second conduction type that is different from the first conduction type;

forming, on the main surface separated from another end of the field relaxation layer, a second semiconductor region that is shaped to include a portion running along the extension portion of the first semiconductor region as viewed along the direction orthogonal to the main surface, and that exhibits the second conduction type; and forming a conductor that is connected to the second semiconductor region, and that has an end portion on the first conductor region side positioned within the range of the field relaxation layer.

According to the present invention, a semiconductor device in which decreases in withstand voltage are suppressed, and a manufacturing method for the semiconductor device can be provided.

BRIEF DESCRIPTION OF THE DRAWINGS

Exemplary embodiments of the present invention will be described in detail based on the following figures, wherein:

FIGS. 2A, 2B are cross-sections illustrating an example of a configuration of a semiconductor device according to an exemplary embodiment;

DETAILED DESCRIPTION

Explanation follows regarding a semiconductor device of an exemplary embodiment, and a manufacturing method for the semiconductor device, with reference to FIG. 1 to FIG. 4F. The present exemplary embodiment explains an example of a mode in which the semiconductor device according to the present invention is applied to an N-type metal oxide semiconductor field effect transistor (MOSFET; also sometimes referred to as a MOS transistor below).

Figure 1:
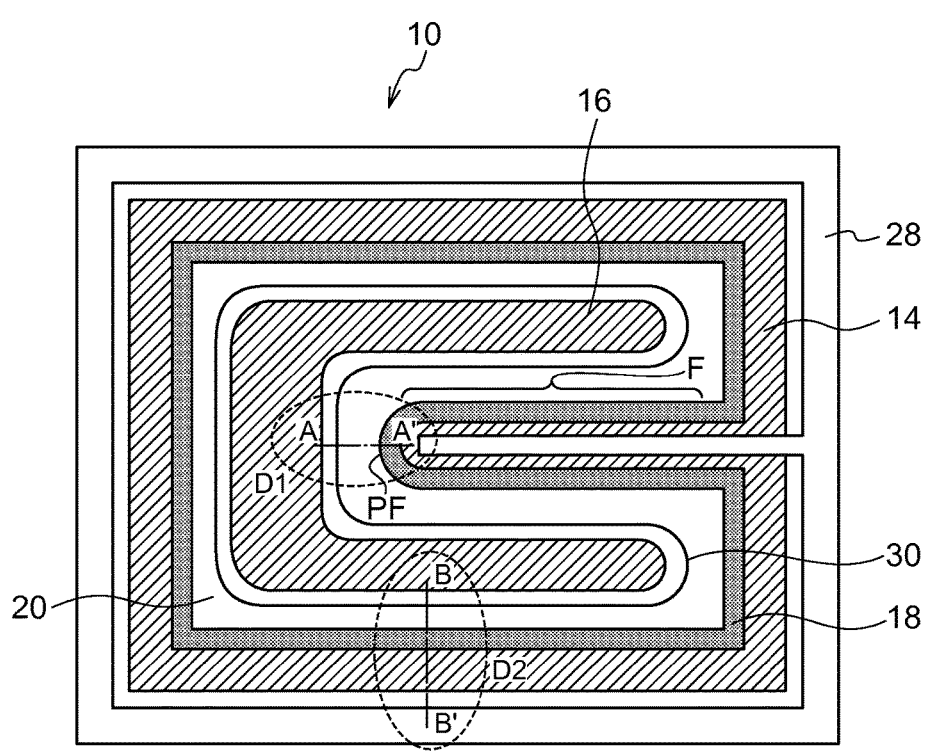
FIG. 1 is a plan view illustrating an example of a configuration of a semiconductor device according to an exemplary embodiment.

FIG. 1 is a plan view of a MOS transistor 10 according to the present exemplary embodiment. FIG. 2A is a cross-section taken along line A-A' in FIG. 1. FIG. 2B is a cross-section taken along line B-B' in FIG. 1. As illustrated in FIG. 1, a region in the vicinity of cross-section A-A' is also referred to as region D1, and a region in the vicinity of the cross-section B-B' is also referred to as region D2 hereafter.

As illustrated in FIG. 1, the MOS transistor 10 according to the present exemplary embodiment is configured including a source layer 14, a drain layer 16, a gate electrode 18, a sub-contact layer 28, and metal wiring 30. The drain layer 16 that is to achieve high withstand voltage, and that is to be applied with a high voltage is disposed at the center of the MOS transistor 10. The surroundings of the drain layer 16 are structured so as to be surrounded by the source layer 14.

The MOS transistor 10 is a transistor that has a similar finger-type structure to the field effect transistor 50. Namely, as illustrated in FIG. 1, the MOS transistor 10 has a U-shaped drain layer 16 that is surrounded by the source layer 14, and a portion of the source layer 14 configures a finger portion F that extends into the U-shaped drain layer 16. In other words, the source layer 14 has an extension portion (the finger portion F) that has a specific width and extends in a specific direction, and the drain layer 16 has a portion running along the extension portion. The MOS transistor 10 illustrated in FIG. 1 enables flow of a large current since long opposing lengths of the source layer 14 and the drain layer 16 can be secured.

As an example, the size of the finger portion F according to the present exemplary embodiment is set with a width of approximately 54 µm, a length of approximately 230 µm, and a semi-circular leading end portion PF is set with a radius of approximately 27 µm. Moreover, the distance between the source layer 14 and the drain layer 16 at the vicinity of the leading end portion PF is set at approximately 121 µm.

The gate electrode 18 is formed running along the source layer 14, and a field oxide layer 20 is formed between the gate electrode 18 and the drain layer 16. The sub-contact layer 28 surrounds the outside of the source layer 14, and a portion of the sub-contact layer 28 also enters into the finger portion F. Although the source layer 14, the drain layer 16, and the sub-contact layer 28 are each connected to the metal wiring 30 through contacts 32 (see FIG. 2A and FIG. 2B), only the metal wiring 30 connected to the drain layer 16 is illustrated in FIG. 1.

As illustrated in FIG. 2A, as seen in the cross-section structure of the vicinity of the region D1, the N$^+$drain layer 16 is formed by N-type impurities diffused in a P-type (P$^-$) substrate 12, and an N drift layer 22 is formed by N-type impurities diffused so as to encompass the drain layer 16. The drain layer 16 is connected to the metal wiring 30 through the contact 32. The metal wiring 30 can be formed using aluminum, copper, or the like. Although explanation is given in the present exemplary embodiment of wiring configured by a single wiring layer, there is no limitation thereto, and wiring configured by multiple wiring layers may be applied. Herein, the drift layer 22 primarily spreads out a depletion layer due to a PN connection arising between the drift layer 22 and the P$^-$ substrate 12, and has a function of raising withstand voltage.

The MOS transistor 10 according to the present exemplary embodiment differs from the field effect transistor 50 according to conventional technology in that a field relaxation layer 26a is formed by P-type impurities diffused below the field oxide layer 20. The field relaxation layer 26a of the MOS transistor 10 according to the present exemplary embodiment is formed such that at least a portion thereof is included within the region of the drift layer 22. The field relaxation layer 26a is a layer for relaxing the field generated between the drain layer 16 and the source layer 14, and has the function of a resurf layer in what is known as a reduced surface field (resurf) structure.

Contrary to the field effect transistor 50, an end portion PA of the metal wiring 30 extends in the direction of the field oxide layer 20, and the end portion PA is disposed so as to overlap with the field relaxation layer 26a. In other words, when the main surface of the substrate 12 is viewed along the vertical direction, the end portion PA is disposed such that the end portion PA is positioned within the range of the field relaxation layer 26a. As an example, the length L in the lateral direction along the surface of the drawing as viewed (see FIG. 3A) of the field relaxation layer 26a according to the present exemplary embodiment is set at approximately 20 µm.

Although the positional relationship between the field relaxation layer 26a and the drift layer 22 is not particularly limited, the field relaxation layer 26a is preferably formed so as to be included inside the drift layer 22. This is because when the field relaxation layer 26a protrudes out from the drift layer 22, the potential of the field relaxation layer 26a and the potential of the substrate 12 are the same potential, and the field relaxation effect is not easily exhibited.

The N$^+$ source layer 14 is formed by N-type impurities diffused in the substrate 12, and a P-type (P$^-$) Vt (threshold value) adjusting layer 24 is formed so as to include the source layer 14. The P-type (P$^+$) sub-contact layer 28 is formed in the Vt adjusting layer 24, and the sub-contact layer 28 and the source layer 14 are connected to the metal wiring 30 through respective contacts 32. The P$^-$ Vt adjusting layer 24 is a layer for adjusting the threshold value of the MOS transistor 10.

As illustrated in FIG. 2A, a gate silicon oxide layer 34 is formed below the gate electrode 18, and a lower portion of the gate silicon oxide layer 34 configures a portion of a channel region. Side walls 36 are formed at both end portions of the gate electrode 18. The gate electrode 18 may be formed using, for example, polysilicon.

Explanation has been given of a mode in which, in the MOS transistor 10 according to the present exemplary embodiment, the entire drain layer 16 is formed so as to be contained within the drift layer 22, and the entire source layer 14 is formed so as to be contained in the Vt adjusting layer 24; however, there is no limitation thereto, and a mode may be configured such that just a portion of the entire drain layer 16 and a portion of the entire source layer 14 are contained in the drift layer 22 and the Vt adjusting layer 24, respectively, as long as each function is exhibited.

A distance a between an end portion of the drift layer 22 and an end portion of the Vt adjusting layer 24 that face each other is set longer in the vicinity of the region D1 than a distance b between an end portion of the drift layer 22 in the vicinity of the region D2, described layer, and an end portion of the Vt adjusting layer 24 (a>b). This is to enhance the effect of relaxation of the field concentration in the vicinity of the finger portion F, and in particular, in the vicinity of the leading end portion PF.

As illustrated in FIG. 2B, the cross-section structure of the vicinity of the region D2 has a substantially similar structure to the cross-section structure of the vicinity of the region D1. However, as described above, the distance b between the end portion of the drift layer 22 and the end portion of the Vt adjusting layer 24 is shorter than the distance a between the end portion of the drift layer 22 and the end portion of the Vt adjusting layer 24 in the vicinity of the region D1 (a<b). Moreover, a P-type field relaxation layer 26b is formed below the field oxide layer 20.

Contrary to the field effect transistor 50, in the vicinity of the region D2, an end portion PB of the metal wiring 30 that is connected to the drain layer 16 extends in the direction of the field oxide layer 20, and is disposed so as to overlap with the field relaxation layer 26b. Namely, when the main surface of the substrate 12 is viewed along the vertical direction, the end portion PB is disposed so as to be positioned within the range of the field relaxation layer 26b. As an example, a and b are set at a=95 µm and b=6 µm in the MOS transistor 10 according to the present exemplary embodiment. Also as an example, the length of the field relaxation layer 26b in the lateral direction along the surface of the drawing as viewed is set at from 40 µm to 60 µm.

As described above, one feature of the MOS transistor 10 according to the present exemplary embodiment is that the field relaxation layer 26a is provided in the vicinity of the region D1, and when the main surface of the substrate 12 is viewed along the vertical direction, the end portion PA of the metal wiring 30 is disposed so as to be positioned within the range of the field relaxation layer 26a. Moreover, another feature is that when the main surface of the substrate 12 is viewed along the vertical direction in the vicinity of the region D2, the end portion PB of the metal wiring 30 is disposed so as to be positioned within the range of the field relaxation layer 26b. Although the MOS transistor 10 according to the present exemplary embodiment suppresses decreases in withstand voltage due to these features, there is no need to provide both of these features, and advantageous effects can be exhibited by providing just one of these features.

Figure 3A:
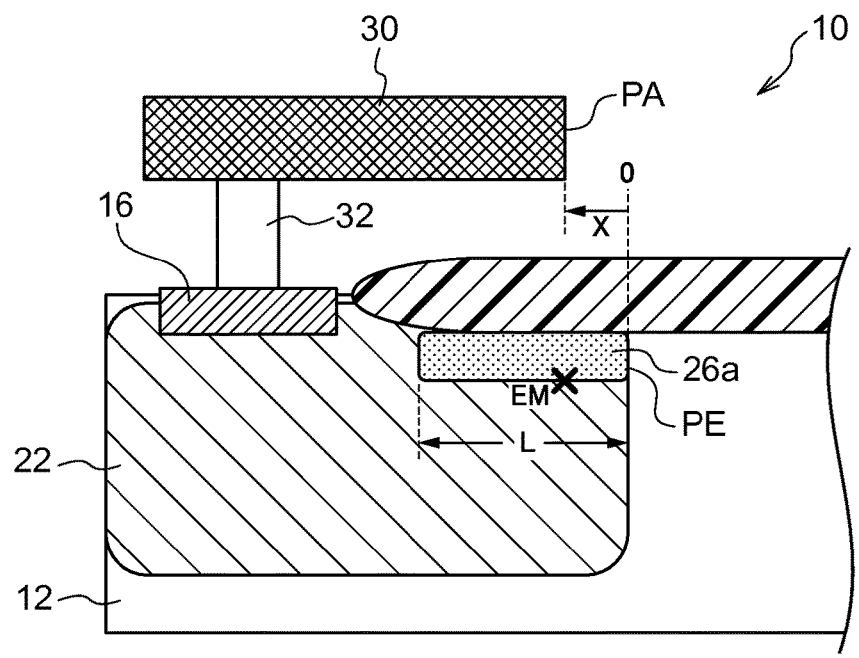
FIG. 3A is a partial enlarged view illustrating a periphery of a drain layer of a semiconductor device according to an exemplary embodiment.
Figure 3B:
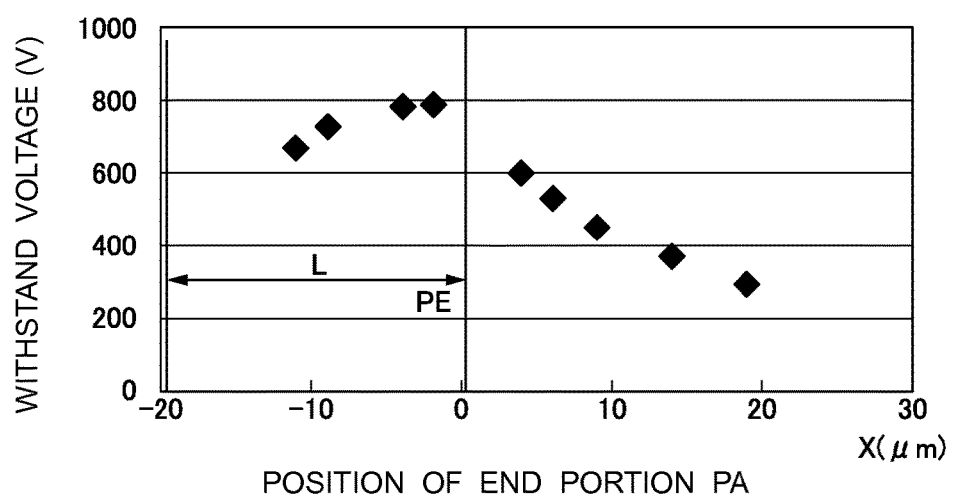
FIG. 3B is a graph illustrating a relationship between a position of an end portion of metal wiring of a semiconductor device according to an exemplary embodiment and withstand voltage.

Detailed explanation next follows regarding configuration and advantageous effects of the features in the vicinity of the region D1, with reference to FIGS. 3A, 3B. Although explanation is given of an example of the features in the region D1, the configuration and advantageous effects of the features in the region D1 also apply to features in the region D2.

FIG. 3A is a diagram illustrating an enlarged view of the periphery of the drain layer 16 of the MOS transistor 10 illustrated in FIG. 2A. The field relaxation layer 26a is primarily provided to relax a field concentrated in the vicinity of the finger portion F, out of a field occurring between the drain layer 16 and the source layer 14. In the MOS transistor 10 according to the present exemplary embodiment, the approximate position between the drain layer 16 and the source layer 14 where the generated field reaches a maximum is a position denoted a maximum field location EM in FIG. 3A.

As described above, when the main surface of the substrate 12 is viewed in the vertical direction, the end portion PA of the metal wiring 30 is disposed so as to be positioned within the range of the field relaxation layer 26a that has a lateral direction length of L. This is because a field concentrates at the end portion PA since high voltage is applied to the metal wiring 30 connected to the drain layer 16 in the MOS transistor 10 according to the present exemplary embodiment, and the field relaxation layer 26a relaxes the concentrated field.

The length of the field relaxation layer 26a in the MOS transistor 10 according to the present exemplary embodiment is approximately 20 µm as an example, and the high voltage applied to the metal wiring 30 connected to the drain layer 16 is 600V as an example.

FIG. 3B is a graph illustrating results of actual measurements of the effect of the positional relationship between the end portion PA of the metal wiring 30 and the field relaxation layer 26a on the withstand voltage of the MOS transistor 10. In FIG. 3B, the end portion of the source layer 14 side of the field relaxation layer 26a is denoted end portion PE, the position of the end portion PE is taken as the origin, the lateral direction along the drawing surface is taken as the x-axis with the right direction as the positive direction, and position of the end portion PA is expressed by a coordinate x. The vertical axis represents withstand voltage (V).

As illustrated in FIG. 3B, the withstand voltage in the MOS transistor 10 according to the present exemplary embodiment is high when the end portion PA of the metal wiring 30 is positioned above the field relaxation layer 26a (namely, when −L <x<0). However, it is apparent that the withstand voltage has a maximum value of approximately 800V when x is within the range of from −2 μm to −4 μm. Namely, the end portion PA of the metal wiring 30 is preferably above the field relaxation layer 26a, but the withstand voltage is reduced in cases in which the amount of overlap between the metal wiring 30 and the field relaxation layer 26a is reduced to a given value or below (when the absolute value of x is large when x<0). The withstand voltage is reduced in cases in which the metal wiring 30 covers an excessive amount of the field relaxation layer 26a (when the value of x is large and x>0). It is therefore apparent that disposing the end portion PA of the metal wiring 30 within the region indicated by the length L of the field relaxation layer 26a and, more specifically, within a specific range of the region indicated by the length L of the field relaxation layer 26a, is more important than the metal wiring 30 covering the field relaxation layer 26a.

Namely, in the MOS transistor 10 according to the present exemplary embodiment, positioning the end portion PA of the metal wiring 30 within the range of the field relaxation layer 26a causes the advantageous effect of suppressing decreases in the withstand voltage to be exhibited. However, there exists an optimal value for the positional relationship between the end portion PA of the metal wiring 30 and the field relaxation layer 26a, and that optimal value is a setting at which from 2 μm to 4 μm remains from the end portion PE of the field relaxation layer 26a, and the metal wiring 30 covers the field relaxation layer 26a. In other words, the end portion PA of the metal wiring 30 is disposed so as to be positioned within the range of the field relaxation layer 26a, and from 2 μm to 4 μm away from the source layer 14 side of the field relaxation layer 26a Explanation next follows regarding an example of a manufacturing method for the MOS transistor 10 that serves as a semiconductor device according to the present exemplary embodiment, using a local oxidation of silicon (LOCOS) method, with reference to FIGS. 4A to 4F. Although explanation follows regarding an example of a manufacturing method using the LOCOS method in the present exemplary embodiment, there is no limitation thereto, and a manufacturing method that uses a shallow trench isolation (STI) method or the like may be applied.

First, thermal oxidation treatment is carried out on a Si substrate, and a preliminary oxide layer (not illustrated in the drawings) is formed from $SiO_2$ (a silicon oxide layer) having a thickness of approximately 700 nm.

Next, after applying a photoresist onto the preliminary oxide layer, a mask having an opening is formed in a portion corresponding to the drift layer 22 by patterning using photolithography. Then, the preliminary oxide layer is etched using the mask, and an opening is formed.

Next, a protective oxide layer is formed from $SiO_2$ having a thickness of approximately 120 nm by thermal oxidation treating a wafer.

Next, an N-type impurity, such as P (phosphor), is implanted through the protective oxide layer and the opening in the preliminary oxide layer using an ion implantation method, the N-type impurity is diffused, and the N-type drift layer 22 is formed.

Next, drive-in is performed using heat treatment on the wafer. Namely, the P implanted in the drift layer 22 is activated, and the region of the drift layer 22 is adjusted (see FIG. 4A).

Next, the oxide layer on the whole surface of the wafer (the preliminary oxide layer and the protective oxide layer) is removed by etching or the like.

Next, after applying a photoresist to the whole surface of the wafer, patterning is performed using photolithography, and a mask is formed with an opening in a portion corresponding to the Vt adjusting layer 24.

Figure 4A:
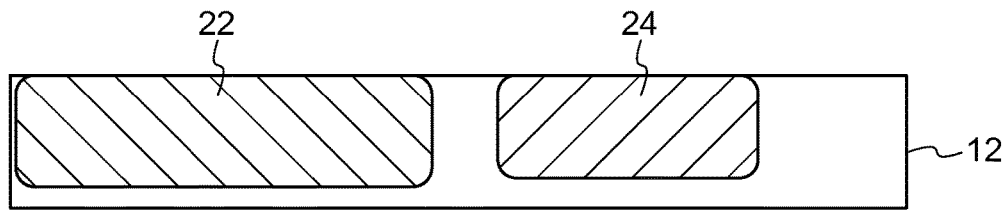
FIGS. 4A to 4F are partial vertical cross-sections for explaining an example of a manufacturing method of a semiconductor device of an exemplary embodiment.

Next, a P-type impurity, such as B (boron), is implanted through the opening using an ion implantation method that uses the mask, the P-type impurity is diffused, and the P-type Vt adjusting layer 24 is formed (see FIG. 4A).

Figure 4B:
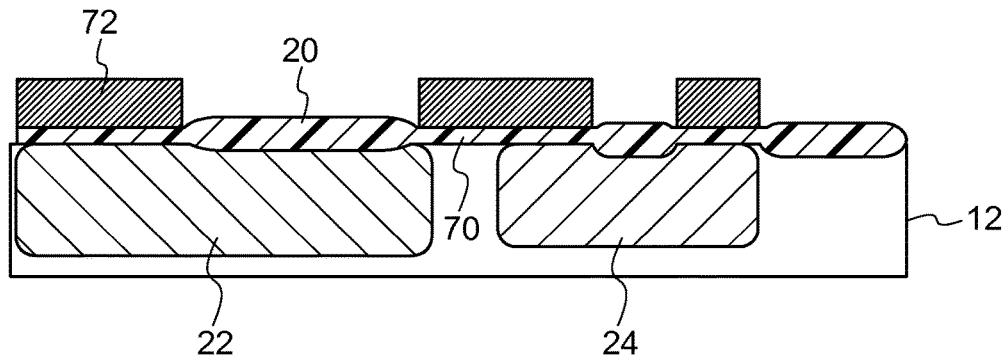

Next, a pad oxide layer (an $SiO_2$ layer) 70 is formed by performing thermal oxidation treatment on the wafer, and a silicon nitride layer (SiN layer) 72 is formed on the pad oxide layer by, for example, low pressure-chemical vapor deposition (LP-CVD) (see FIG. 4B).

Next, the silicon nitride layer 72 is etched using photolithography, and a mask is formed with an opening in a portion corresponding to the field oxide layer 20.

Next, thermal oxidation treatment is performed using the mask, and the field oxide layer (LOCOS oxide layer) 20 is formed (see FIG. 4B).

Next, the silicon nitride layer 72 is removed using etching such as reactive ion etching (RIE).

Next, the pad oxide layer 70 is removed using etching or the like.

Next, a sacrificial oxide layer having a thickness of approximately 40 nm (not illustrated in the drawings) is formed from $SiO_2$ on the entire surface of the wafer by thermal oxidation treating the wafer.

Next, after applying a photoresist, patterning is performed using photolithography, and a mask 74 is formed with an opening in a portion corresponding to the field relaxation layer 26a.

Figure 4C:
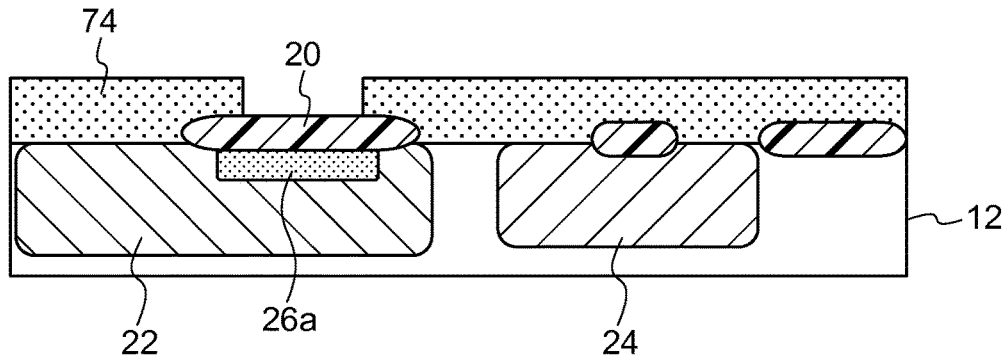
Figure 4D:
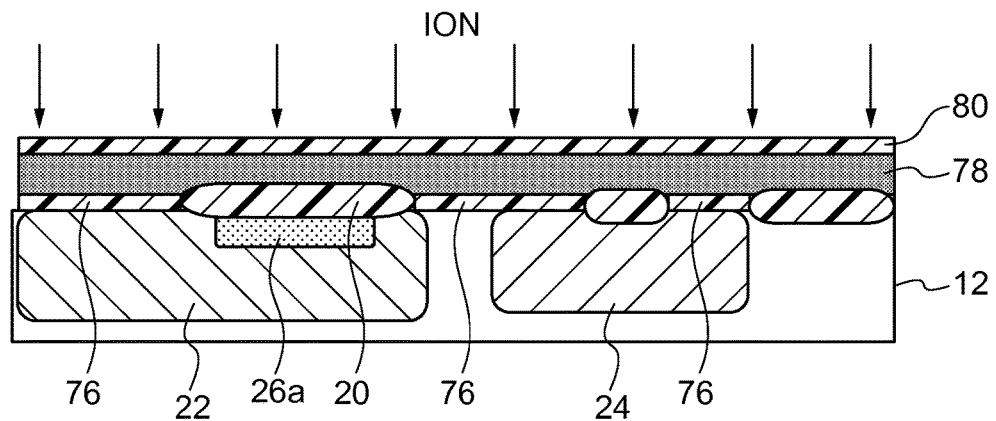

Next, a P-type impurity, such as B (boron), is implanted through the field oxide layer 20 using an ion implantation method that uses the mask 74, the P-type impurity is diffused, and the P-type field relaxation layer 26a is formed (see FIG. 4C).

Next, the sacrificial oxide layer is removed using etching or the like.

Next, a gate oxide layer 76 is formed around the field oxide layer by thermal oxidation treating the wafer.

Next, a polysilicon layer 78 is formed on the gate oxide layer 76 by a CVD method or the like.

Next, a gate non-doped silicate glass (NSG) layer 80 with a thickness of approximately 10 nm is formed on the polysilicon layer 78 by a CVD method or the like.

Next, a resist is applied to the entire surface of the wafer, and a mask for adjusting the concentration of impurities in a specific region of the polysilicon layer 78 is formed by photolithography. The mask is used to, for example, cause the concentration at the gate electrode of the N-type transistor to be different from the concentration of the gate electrode of the P-type MOS transistor. Since the MOS transistor 10 according to the present exemplary embodiment is N-type, N-type impurities, such as P, are implanted using the mask, and concentration adjustment is performed on the polysilicon layer 78 (see FIG. 4D).

Next, the resist is removed.

Next, a mask for forming the gate electrode 18 is formed by photolithography, etching is performed using the mask, and the gate electrode 18 is formed.

Next, an NSG is formed on the entire surface by a CVD method.

Figure 4E:
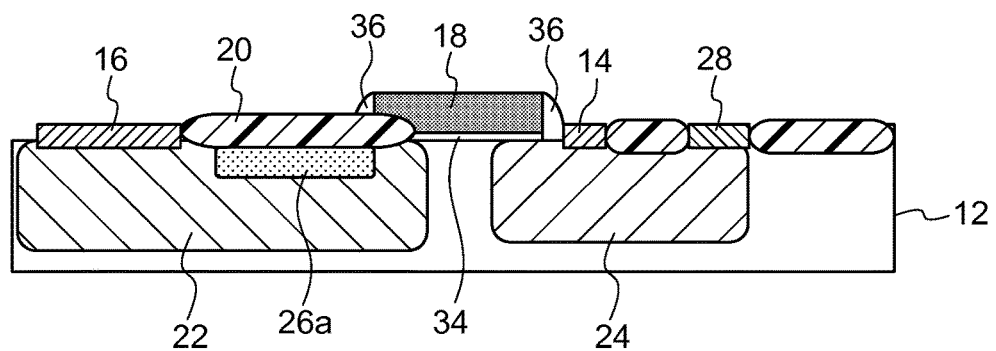

Next, a mask for forming the side wall 36 is formed by photolithography, etching is performed using the mask, and the side wall 36 is formed (see FIG. 4E).

Next, a mask of oxide layer (not illustrated in the drawings) having a thickness of approximately 12 nm is formed by thermal oxidation treating the wafer.

Next, a mask for forming the source layer 14 is formed by photolithography, and N-type impurities, such as As (arsenic), are implanted by an ion injection method that uses the mask, the N-type impurities are diffused, and the N-type source layer 14 is formed.

Next, a mask for forming the drain layer 16 is formed by photolithography, and N-type impurities, such as As (arsenic), are implanted by an ion injection method that uses the mask, the N-type impurities are diffused, and the N-type drain layer 16 is formed (see FIG. 4E).

Although explanation has been given of an example in the present exemplary embodiment in which the drain layer 16 is formed after the source layer 14, this sequence may be reversed such that the source layer 14 is formed after the drain layer 16. Although explanation has been given above regarding formation of a source layer and a drain layer of an N-type MOS transistor, a formation process of a source layer and a drain layer of a P-type MOS transistor is subsequently performed in some cases. In such cases, P-type impurities, such as B, may be implanted into the source layer and the drain layer.

Next, after forming an interlayer dielectric layer 38 formed from, for example, $SiO_2$, lithography and dry etching are used to form contact holes (not illustrated in the drawings) in the interlayer dielectric layer 38 reaching to the source layer 14, the drain layer 16, and the sub-contact layer 28 respectively.

Next, plugs are embedded into the respective contact holes reaching the source layer 14, the drain layer 16, and the sub-contact layer 28 to serve as conductive portions, using W (tungsten), for example, and the contacts 32 are formed.

Figure 4F:
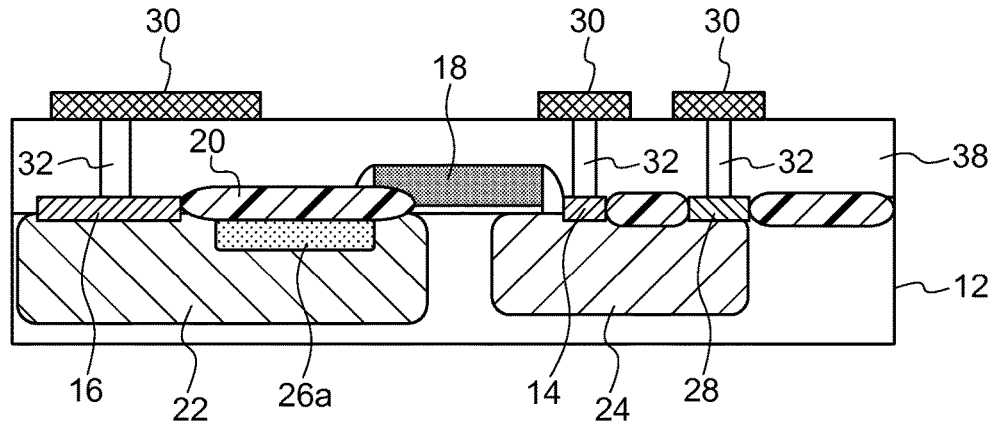
Figure 5:
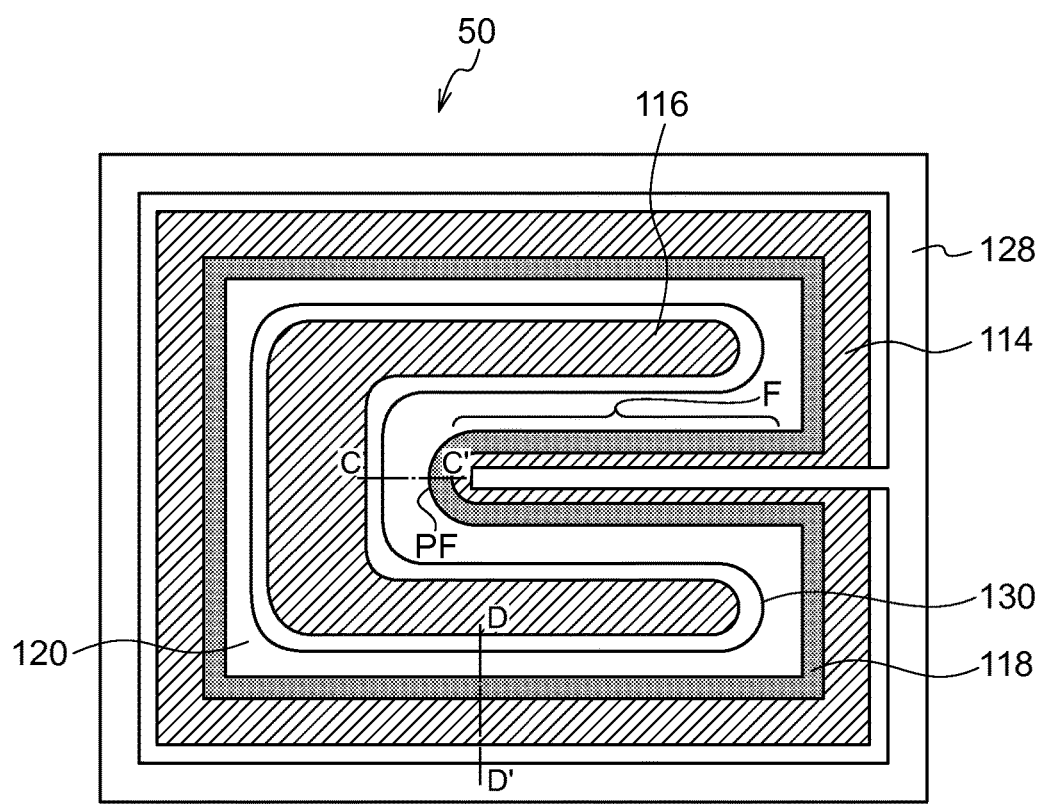
FIG. 5 is a plan view illustrating a configuration of a semiconductor device according to conventional technology.
Figure 6A:
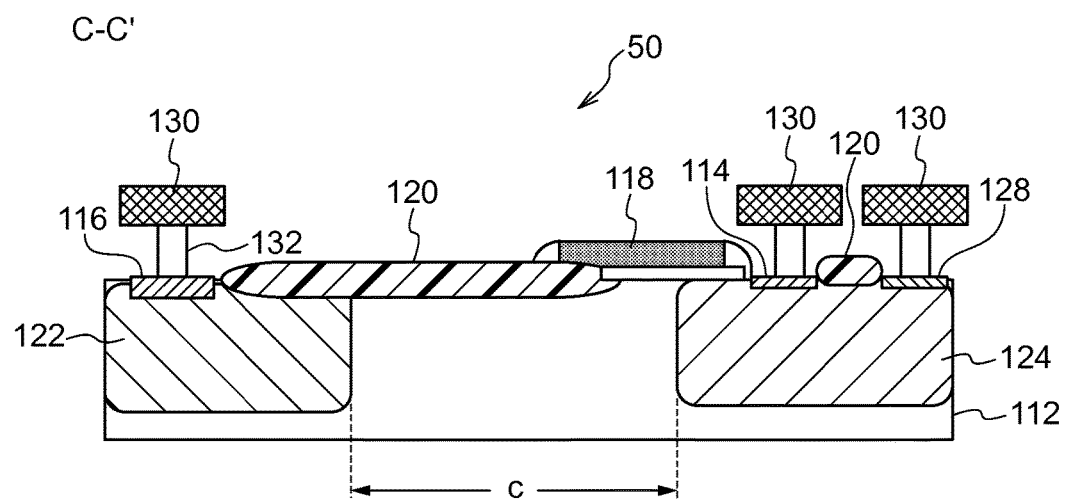
FIGS. 6A, 6B are cross-sections illustrating a configuration of a semiconductor device according to conventional technology.
Figure 6B:
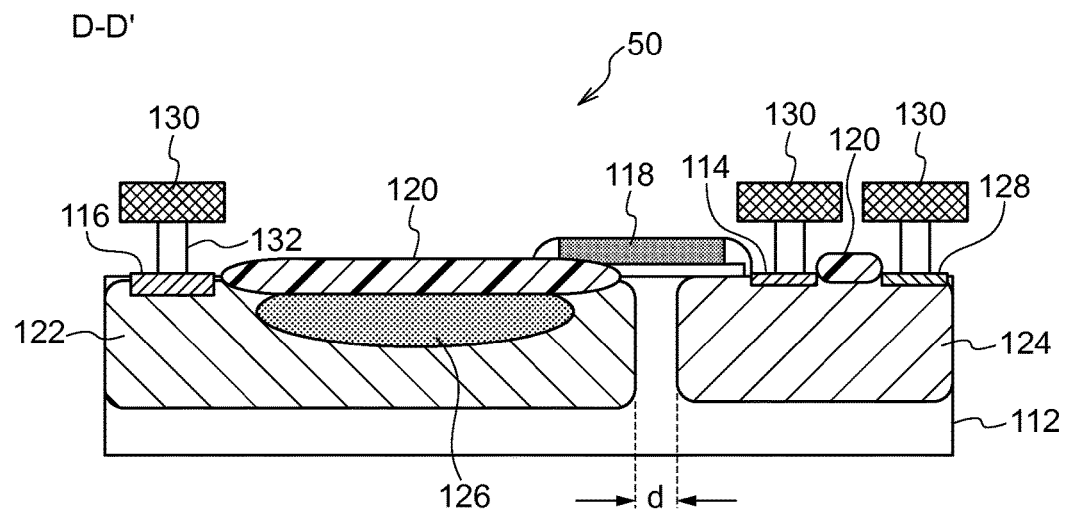

Next, after forming an Al (aluminum) layer, for example, on the entire surface by sputtering or the like, a specific shape is etched to form the metal wiring 30 that is electrically connected to the contacts 32 (see FIG. 4F).

The MOS transistor 10 according to the present exemplary embodiment is manufactured by the manufacturing method above.

Although explanation has been given of an example in the present exemplary embodiment of a mode in which the metal wiring 30 serves as wiring that connects each layer in the semiconductor device, there is no limitation thereto, and another conductor such as polysilicon may be employed.

Although explanation has been given of an example in the present exemplary embodiment of a mode in which the shape of the leading end portion PF of the finger portion F is a semicircle, there is no limitation thereto, and the leading end portion PF may be formed in another shape such as a portion of an ellipse.

Although explanation has been of an example in the present exemplary embodiment in which the semiconductor device and the manufacturing method for the semiconductor device of the present invention are applied to an N-type MOSFET, there is no limitation thereto, and application may be made to a P-type MOSFET.

What is claimed is:

1. A semiconductor device comprising:
a semiconductor substrate;
a first semiconductor region, having a first conduction type, on a main surface of the semiconductor substrate, and that includes an extension portion extending in a specific direction and having a specific width as viewed along a direction orthogonal to the main surface;
a second semiconductor region, having the first conduction type, on the main surface separated from the first semiconductor region, and shaped to include a portion running along the extension portion of the first semiconductor region as viewed along the direction orthogonal to the main surface;
a field relaxation layer on a second semiconductor region side of the main surface, and that is a semiconductor layer having a second conduction type that is different than the first conduction type,
wherein an end portion of the field relaxation layer facing the first semiconductor region coincides with an end portion of the second semiconductor region facing the first semiconductor region; and
a conductor connected to the second semiconductor region, and that has an end portion on a first semiconductor region side positioned within a range of the field relaxation layer.

2. The semiconductor device of claim 1, wherein:
the second semiconductor region has an island shape that includes a portion that runs along the extension portion; and
the first semiconductor region includes the extension portion and surrounds the second semiconductor region.

3. The semiconductor device of claim 1, wherein
a shape of a leading end of the extension portion in an extension direction is a semicircle as viewed along the direction orthogonal to the main surface.

4. The semiconductor device of claim 1, wherein
the end portion of the conductor is disposed at a position from 2μm to 4μm from the end portion of the field relaxation layer facing the first semiconductor region.

5. The semiconductor device of claim 1, further comprising
an insulator on the main surface between the first semiconductor region and the second semiconductor region, and that insulates the first semiconductor region from the second semiconductor region,
wherein the field relaxation layer is on the main surface below the insulating layer.

6. The semiconductor device of claim 1, further comprising:
a field effect transistor having the first semiconductor region as a source, and the second semiconductor region as a drain, wherein the drain is surrounded by the source;
a drift layer on the main surface so as to include at least a portion of the drain and at least a portion of the field relaxation layer, and that is a semiconductor layer having the first conduction type; and
a threshold value adjusting layer on the main surface so as to include at least a portion of the source, and that is a semiconductor layer having the second conduction type,
wherein a distance between the drift layer and the threshold value adjusting layer, facing each other in a vicinity of the extension portion, is longer than a separation between the drift layer and the threshold value adjusting layer facing each other outside of the vicinity of the extension portion.

7. The semiconductor device of claim 6, wherein
the drift layer includes an entirety of the field relaxation layer.

8. The semiconductor device of claim 1, further comprising
a gate electrode having a shape running along an end portion of the first semiconductor region as viewed along the direction orthogonal to the main surface,
wherein a region of an end portion of the extension portion on the main surface corresponding to the gate electrode is separated from a region of the second semiconductor region facing the end portion of the extension portion on the main surface.

9. A method of manufacturing a semiconductor device, the method comprising:
forming, on a main surface of a semiconductor substrate, a field relaxation layer from a semiconductor layer having a first conduction type, and that relaxes a field;
forming, on the main surface separated from one end of the field relaxation layer, a first semiconductor region that is shaped to include an extension portion extending in a specific direction at a specific width as viewed along a direction orthogonal to the main surface, and that has a second conduction type that is different than the first conduction type;
forming, on the main surface separated from another end of the field relaxation layer, a second semiconductor region that is shaped to include a portion running along the extension portion of the first semiconductor region as viewed along the direction orthogonal to the main surface, and that has the second conduction type,
wherein an end portion of the second semiconductor region facing the first semiconductor region coincides with the one end of the field relaxation layer; and
forming a conductor that is connected to the second semiconductor region, and that has an end portion on a first semiconductor region side positioned within a range of the field relaxation layer.

* * * * *